(12) United States Patent
Dao

(10) Patent No.: US 7,442,591 B2
(45) Date of Patent: Oct. 28, 2008

(54) METHOD OF MAKING A MULTI-GATE DEVICE

(75) Inventor: Thuy B. Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 423 days.

(21) Appl. No.: 11/406,638

(22) Filed: Apr. 19, 2006

(65) Prior Publication Data

US 2007/0249103 A1   Oct. 25, 2007

(51) Int. Cl.
*H01L 21/84* (2006.01)
(52) U.S. Cl. .................................... 438/157
(58) Field of Classification Search ............... 438/157
See application file for complete search history.

(56) References Cited

U.S. PATENT DOCUMENTS 5,273,921 A * 12/1993 Neudeck et al. ............ 438/157
6,828,181 B2   12/2004 Chen et al.
2005/0282318 A1 * 12/2005 Dao ........................... 438/151

OTHER PUBLICATIONS

Vinet et al; "Bonded Planar Double-Metal-Gate NMOS Transistors Down to 10 nm"; IEEE Electron Device Letters, vol. 26, No. 5, May 2005.

* cited by examiner

*Primary Examiner*—Thao X. Le
*Assistant Examiner*—Kimberly Trice
(74) *Attorney, Agent, or Firm*—James L. Clingan, Jr.; Michael Balconi-Lamica

(57) ABSTRACT

A semiconductor device has two types of multi-gate transistors, N channel and P channel, in which each type has a bottom gate and a top gate. The bottom gate and the top gate of the N channel transistors are chosen to be of a metal or metals that are for optimizing the performance of the N channel transistors. Similarly, the bottom gate and the top gate of the P channel transistors are chosen to be of a metal or metals that are for optimizing the performance of the P channel transistors.

20 Claims, 13 Drawing Sheets

METHOD OF MAKING A MULTI-GATE DEVICE

FIELD OF THE INVENTION

This invention relates to integrated circuits, and more particularly, to a method of making transistors that have more than one gate.

BACKGROUND OF THE INVENTION

Multi-gate devices typically have two gates with a channel in between. One of the gates, the top gate, is above the channel, and the other gate, the bottom gate, is under the channel. The bottom gate is achieved without requiring much if any increase of the active area for a particular transistor. Among the benefits of multi-gate devices are increased current drive, a logic function for a single transistor when the bottom and top gates are independent, and elimination of drain induced barrier lowering. The applicability of multi-gate transistors has been adversely impacted by the difficulty in finding methods of making them that are manufacturable, that do not introduce additional issues, and that take advantage of the benefits of a multi-gate transistor.

Thus, there is a need for a technique that improves on the combination of desires to be manufacturable, not introduce additional issues, and take advantage of the benefits of a multi-gate transistor.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a semiconductor device has two types of multi-gate transistors, N channel and P channel, in which each type has a bottom gate and a top gate. The bottom gate and the top gate of the N channel transistors are chosen to be of a metal or metals that are for optimizing the performance of the N channel transistors. Similarly, the bottom gate and the top gate of the P channel transistors are chosen to be of a metal or metals that are for optimizing the performance of the P channel transistors. This is better understood by reference to the drawings and the following description.

Figure 1:
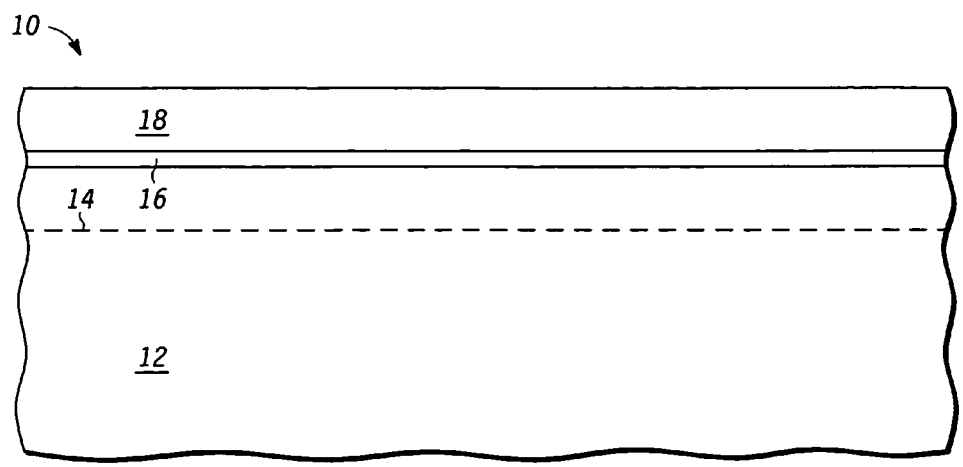
FIG. 1 is a cross section of a semiconductor device at a stage in a process that is according to an embodiment of the invention.

Shown in FIG. 1 is a semiconductor device structure 10 having a semiconductor layer 12, a gate dielectric on semiconductor layer 16, and a gate metal 18 on gate dielectric 16. In this example, semiconductor layer 12 comprises undoped monocrystalline silicon and is part of a semiconductor substrate comprised of silicon. Semiconductor layer 12 could be of a semiconductor material different from silicon. Gate dielectric 16 in this example is preferably a high K dielectric such as hafnium oxide that is about 15 Angstroms thick. The high dielectric constant is beneficial but so is the high degree of selectivity to some etch chemistries. Other examples of high K dielectrics currently under consideration are lanthanum silicon nitride and hafnium nitride. In this example, the gate metal 18 is selected to be titanium nitride (TiN) of about 100 Angstroms thick. TiN is preferred for its benefits with regard to N channel transistors. The work function of the metal is a major consideration with regard to its choice for use with N channel transistors versus use with P channel transistors. Thus, another metal which is beneficial for use with N channel transistors may also be found to be effective and chosen for the metal for gate metal 18. A cleave line 14 is shown about 100 Angstroms from gate dielectric 16. Cleave line 14 is preferably formed by a hydrogen implant prior to the formation gate dielectric 16. A sacrificial oxide layer is present before the implant. After the implant the sacrificial oxide layer is removed and gate dielectric 16 is deposited.

Figure 2:
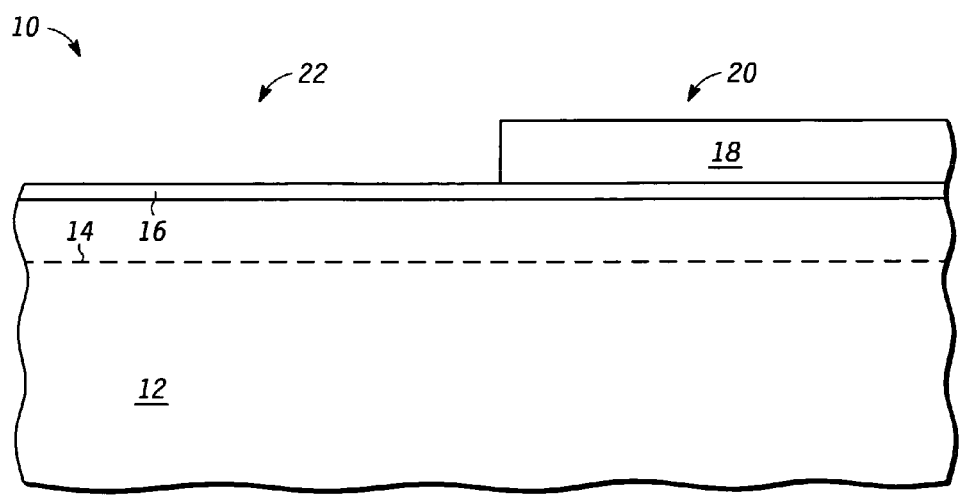
FIG. 2 is a cross section of the semiconductor device at a stage in the process subsequent to that shown in FIG. 1.

Shown in FIG. 2 is semiconductor device structure 10 after a patterned etch of gate metal 18. In this case the area occupied by gate metal 18 after the etch is N channel region 20 and the area where gate metal 18 has been removed is P channel region 22.

Figure 3:
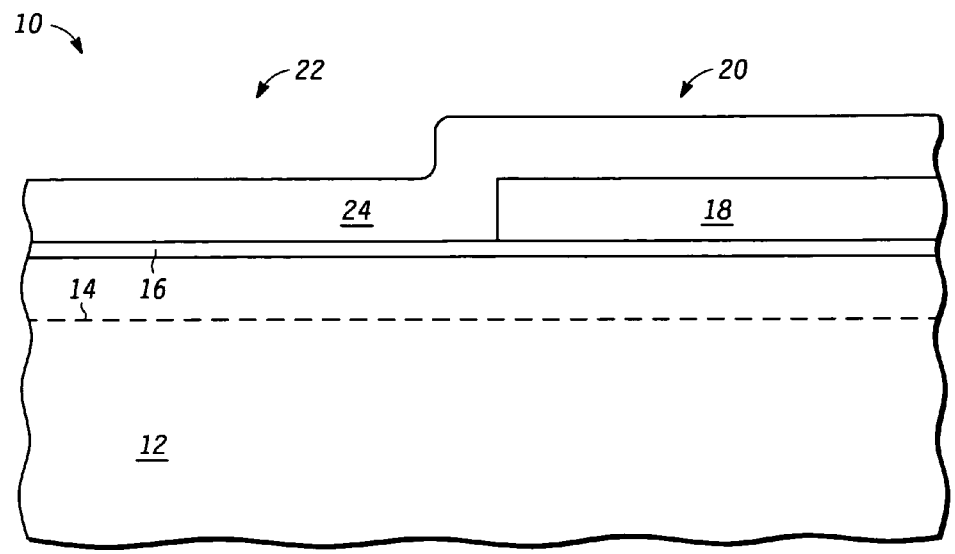
FIG. 3 is a cross section of the semiconductor device at a stage in the process subsequent to that shown in FIG. 2.

Shown in FIG. 3 is semiconductor device structure 10 after deposition of a gate metal 24 in both P channel region 22 and N channel region 20. This results in gate metal 24 being on gate dielectric 16 in P channel region 22 and on gate metal 18 in N channel region 20. The composition of gate metal 24 is chosen for its benefits with regard to P channel transistors. In this example, tantalum silicon nitride is preferred for P channel transistors. Another metal that is beneficial for use with P channel transistors could also be used. In this example, the gate metal for the N channel was deposited first, but the sequence could be reversed. As alternative, a polishing step could be performed after the deposition of gate metal 24 so that gate metal 24 would be removed from N channel region 20 and the top surfaces of gate metals 18 and 24 would be co-planar.

Figure 4:
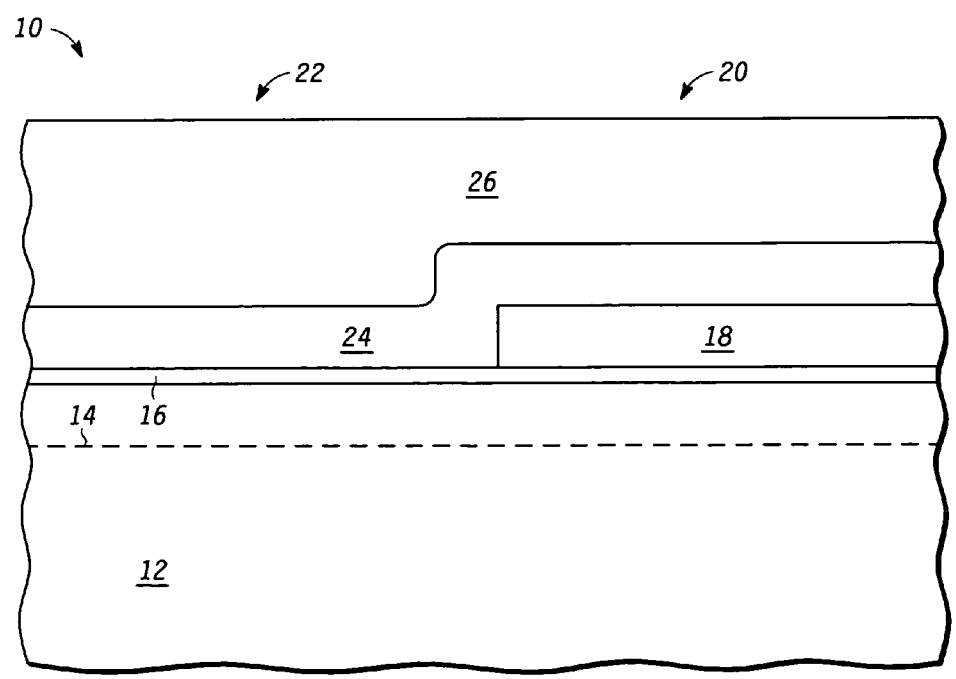
FIG. 4 is a cross section of the semiconductor device at a stage in the process subsequent to that shown in FIG. 3.

Shown in FIG. 4 is semiconductor device structure 10 after depositing a polysilicon layer 26. Polysilicon layer 26 is blanket deposited to a thickness of about 1000 Angstroms. If necessary to achieve a planar surface of polysilicon layer 26, a polish step may be performed. This may not be necessary due to polysilicon layer being so much thicker than gate metal 24. Also, polysilicon layer 26 is unlikely to need polishing if a polish step is performed on gate metal 24 before the deposition of polysilicon layer 26.

Figure 5:
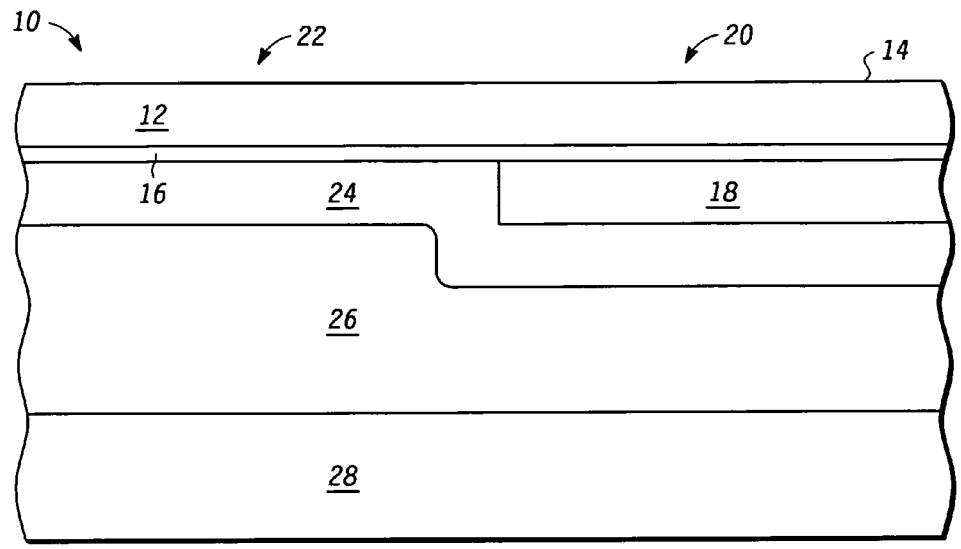
FIG. 5 is a cross section of the semiconductor device at a stage in the process subsequent to that shown in FIG. 4.

Shown in FIG. 5 is semiconductor device structure 10, inverted from FIGS. 1-4, after bonding polysilicon layer 26 to a handle wafer 28 that provides structural support as a substrate and has a dielectric layer at the interface with polysilicon layer 26. FIG. 5 also shows that semiconductor layer 12 has been cleaved at cleave line 14 leaving a thickness of about 100 Angstroms of semiconductor material for use as a channel. The cross section of semiconductor device structure 10 in the FIGS. are in P and N channel active regions. Outside of these active regions, gate metals 24 and polysilicon layer 26 are etched according to a desired interconnect path. The interconnect path includes an area outside of the active region where gate metals 24 and 18 can be contacted from above in later process steps. This particular aspect of connecting to bottom gates is known to one of ordinary skill in the art.

Figure 6:
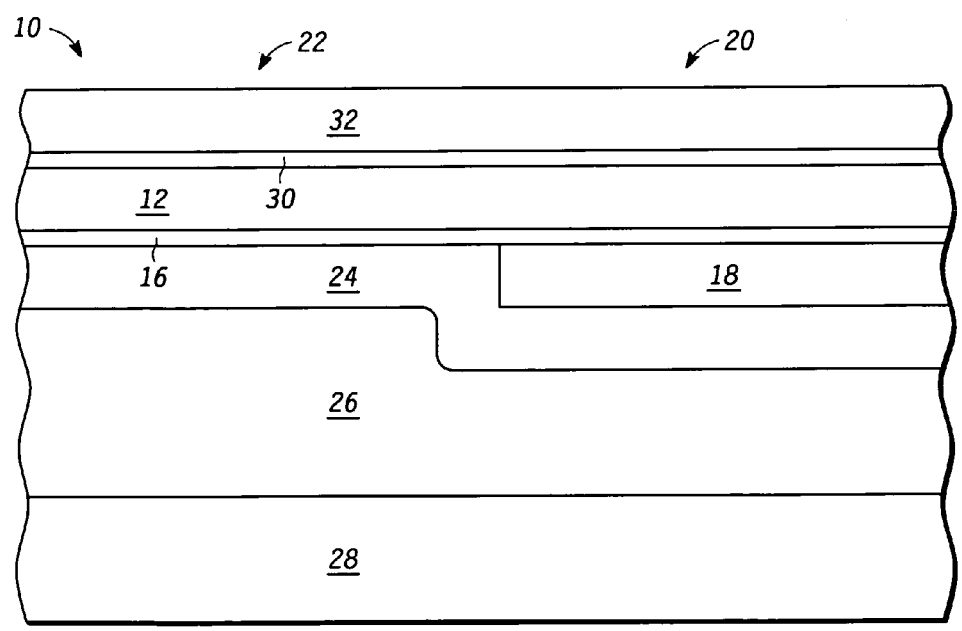
FIG. 6 is a cross section of the semiconductor device at a stage in the process subsequent to that shown in FIG. 5.

Shown in FIG. 6 is semiconductor device structure 10 after depositing a gate dielectric 30 of about 15 Angstroms on semiconductor layer 12 and a gate metal 32 of about 100 Angstroms on gate dielectric 30. In this case, gate metal 32 is preferably the metal chosen for the P channel transistors, which in this example is tantalum silicon nitride.

Figure 7:
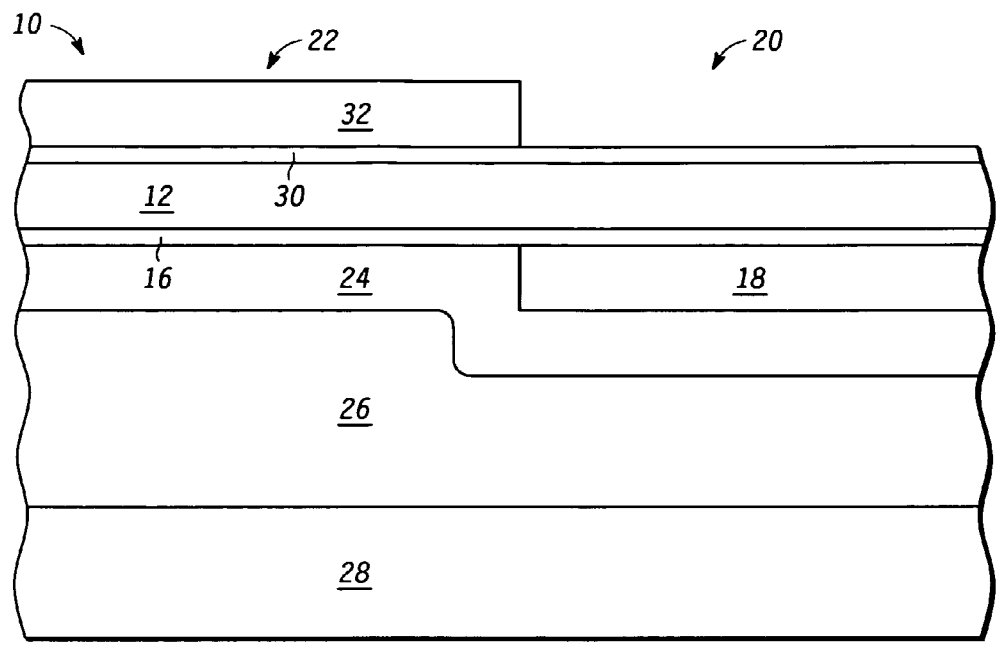
FIG. 7 is a cross section of the semiconductor device at a stage in the process subsequent to that shown in FIG. 6.

Shown in FIG. 7 is semiconductor device structure 10 after gate metal 32 has been selectively etched so as to be remaining in P channel region 22 and removed from N channel region 20. This is analogous to the selective removal of gate metal 18 as shown in FIG. 2.

Figure 8:
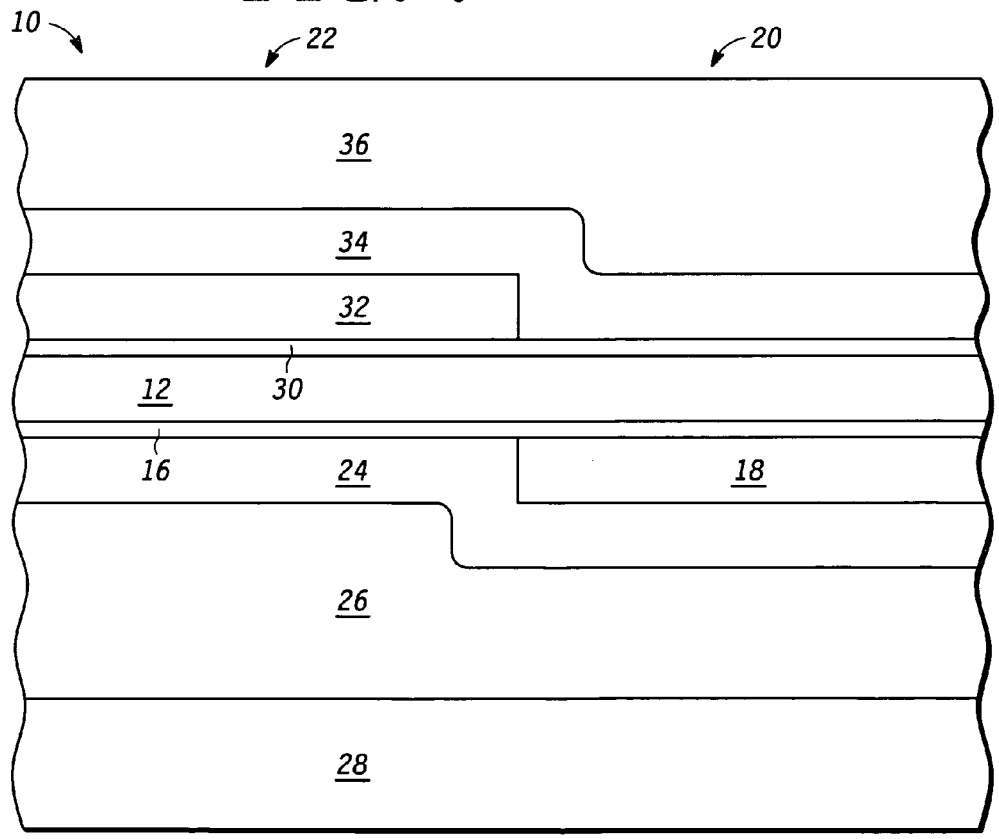
FIG. 8 is a cross section of the semiconductor device at a stage in the process subsequent to that shown in FIG. 7.

Shown in FIG. 8 is semiconductor device structure 10 after deposition of a gate metal 34 to a thickness of about 100 Angstroms on gate metal 32 in P channel region 22 and on gate dielectric 30 in N channel region 20 and after deposition of a polysilicon layer 36 to a thickness of about 1000 Angstroms on gate metal 34. An optional polish step could be performed to planarize the surfaces of gate metals 32 and 34. The polish step would be particularly preferable if a polish step had been used to cause the surfaces of gate metals 18 and 24 to be co-planar.

Figure 9:
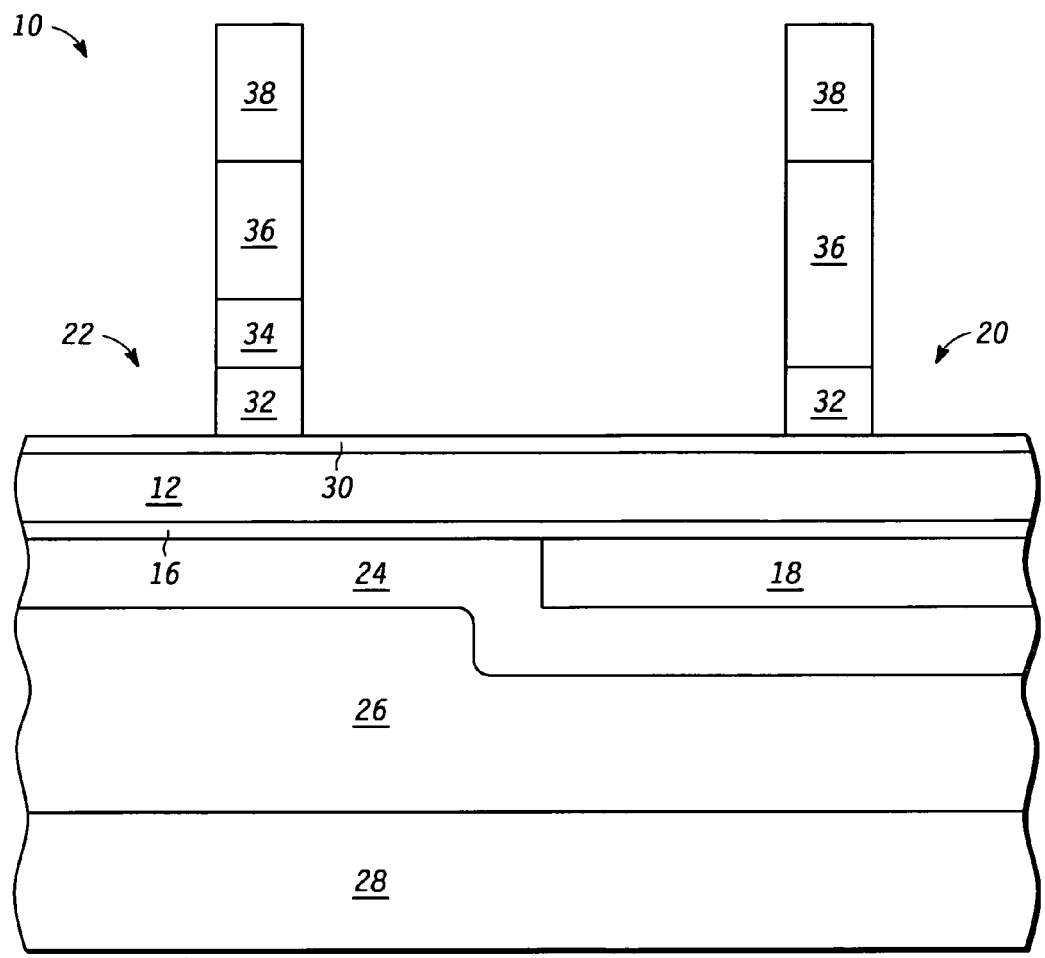
FIG. 9 is a cross section of the semiconductor device at a stage in the process subsequent to that shown in FIG. 8.

Shown in FIG. 9 is semiconductor device structure 10 after forming a hard mask 38 on polysilicon layer 36 and using hard mask 38 for patterning an etch through polysilicon layer 36 and gate metal layers 32 and 34. This leaves two top gate structures; one for P channel region 22 and one for N channel region 20. The P channel top gate has gate metal 32 on gate dielectric 30 in P channel region 22 and the N channel top gate has gate metal 34 on gate dielectric 30 in N channel region 20. A mask that is patterned from photoresist but is not itself photoresist is often called a hard mask.

Figure 10:
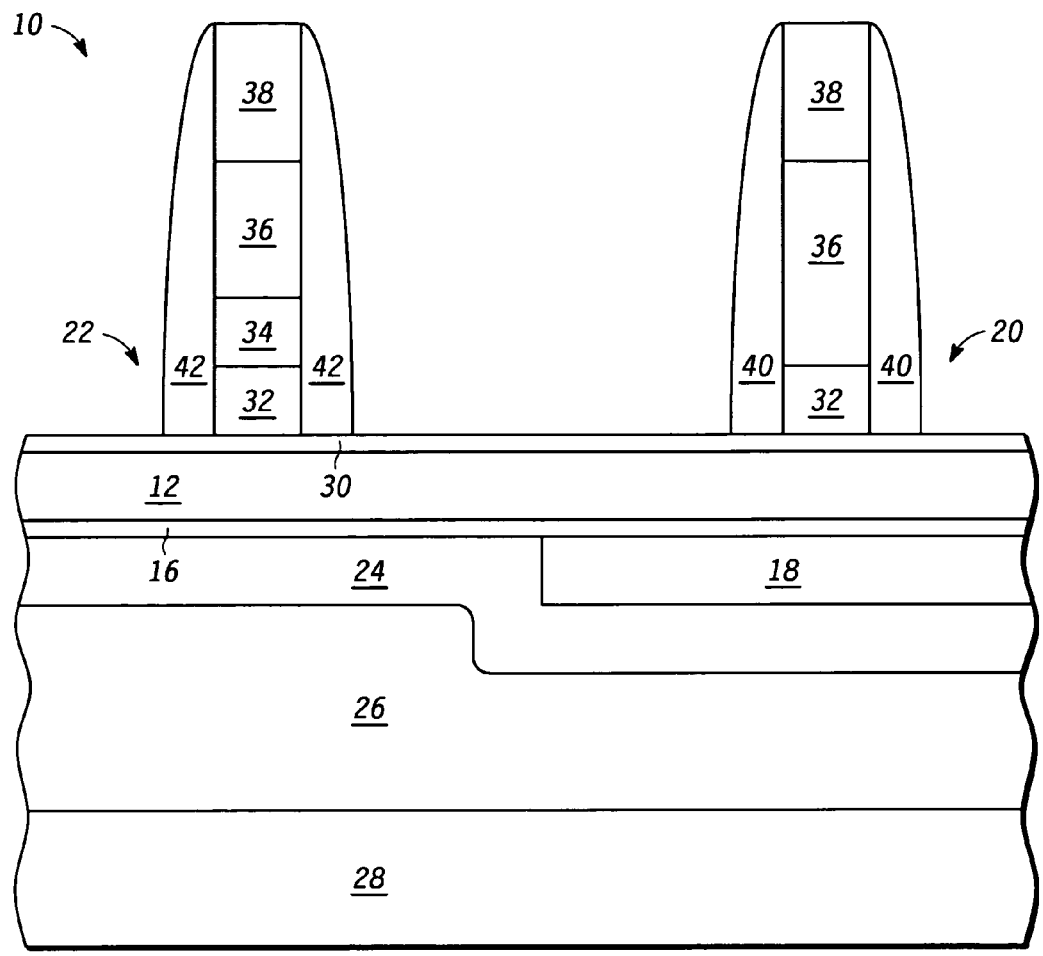
FIG. 10 is a cross section of the semiconductor device at a stage in the process subsequent to that shown in FIG. 9.

Shown in FIG. 10 is semiconductor device structure 10 after formation of a sidewall spacer 40 around the N channel top gate and a sidewall spacer 42 around the P channel gate stack. Sidewall spacers 40 and 42 are formed at the same time by depositing a conformal layer of nitride and performing an anisotropic etch back then repeating the process using a layer of oxide. Thus sidewall spacers 40 and 42 are mostly nitride but have an outer oxide layer.

Figure 11:
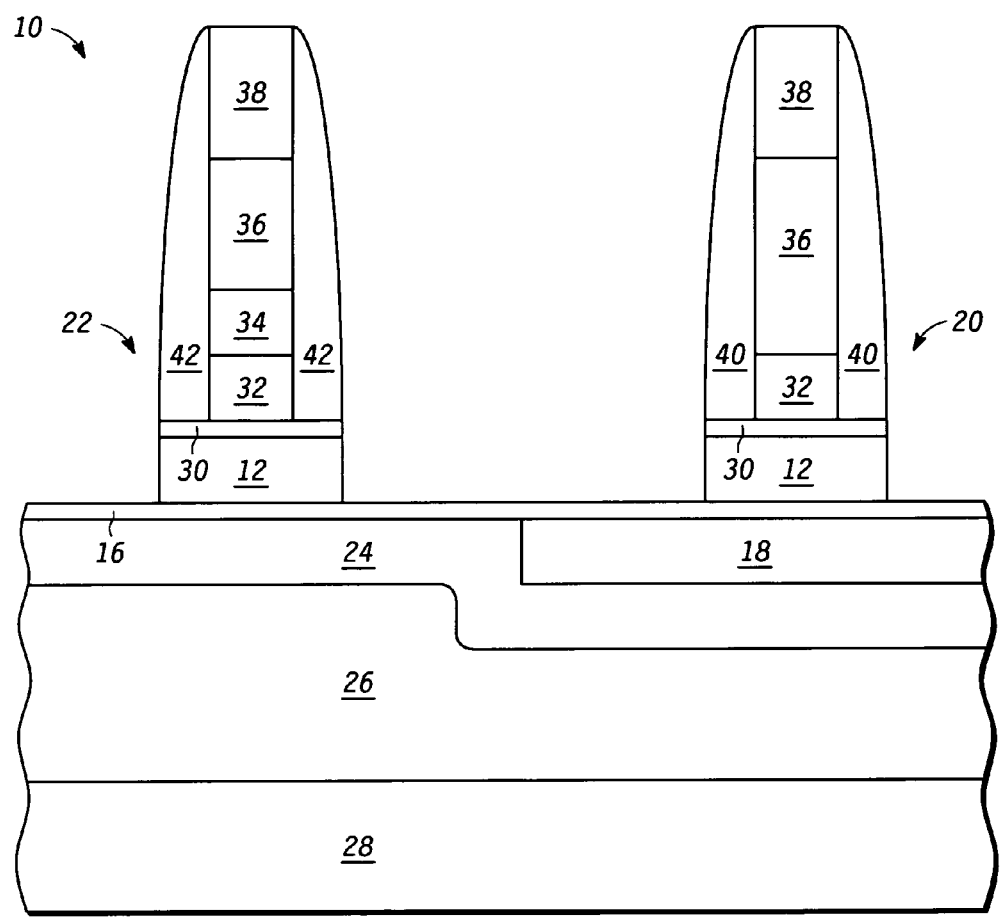
FIG. 11 is a cross section of the semiconductor device at a stage in the process subsequent to that shown in FIG. 10.

Shown in FIG. 11 is semiconductor device structure 10 after performing another anisotropic etch through gate dielectric 30 and semiconductor layer 12 using sidewall spacers 42 and 44 as a mask. This results in semiconductor layer 12 extending outside of the P and N channel top gate stacks. The portion of semiconductor layer 12 under the N channel top gate will be used for the channel of the N channel transistor to be formed in N channel region 20. Similarly, the portion of semiconductor layer 12 under the P channel top gate will be used for the channel of the P channel transistor to be formed in P channel region 22. Sidewall spacers 44 and 46 are formed at the same time by depositing a layer of conformal oxide and etching back using an anisotropic etch.

Figure 12:
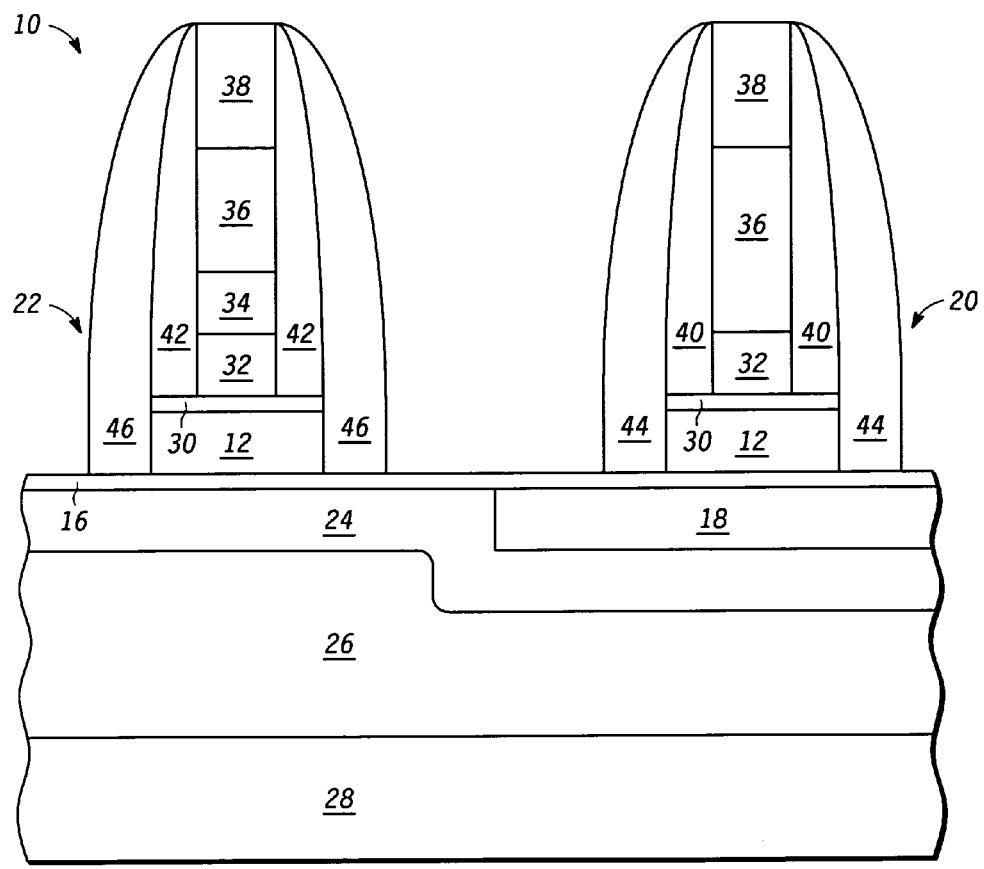
FIG. 12 is a cross section of the semiconductor device at a stage in the process subsequent to that shown in FIG. 11.

Shown in FIG. 12 is semiconductor device structure 10 after forming a sidewall spacer 44 around sidewall spacer 40 and a sidewall spacer 46 around sidewall spacer 42. Sidewall spacer 46 also is around the P channel, and sidewall spacer 44 also is around the N channel.

Figure 13:
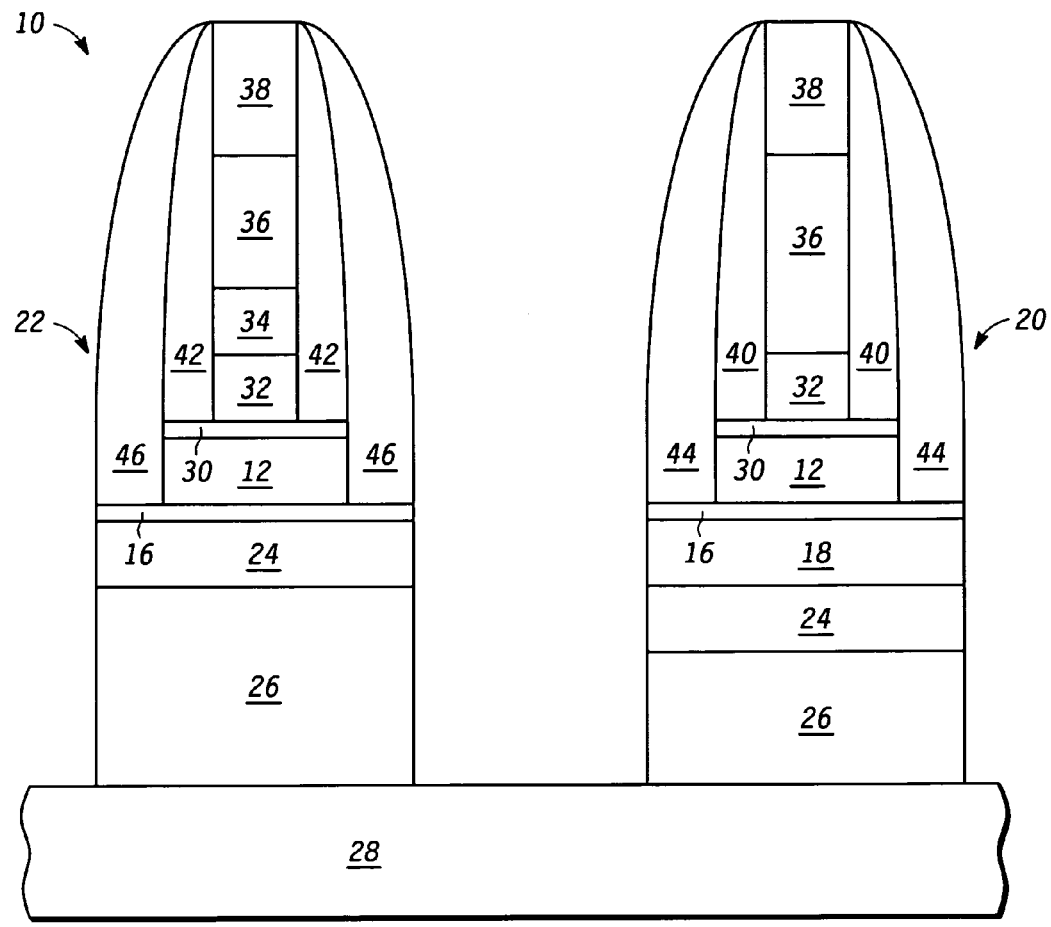
FIG. 13 is a cross section of the semiconductor device at a stage in the process subsequent to that shown in FIG. 12.

Shown in FIG. 13 is semiconductor device structure 10 after anisotropically etching through gate metals 18 and 24 and through polysilicon layer 26 to handle substrate 28 using sidewall spacers 44 and 46 as masks.

Figure 14:
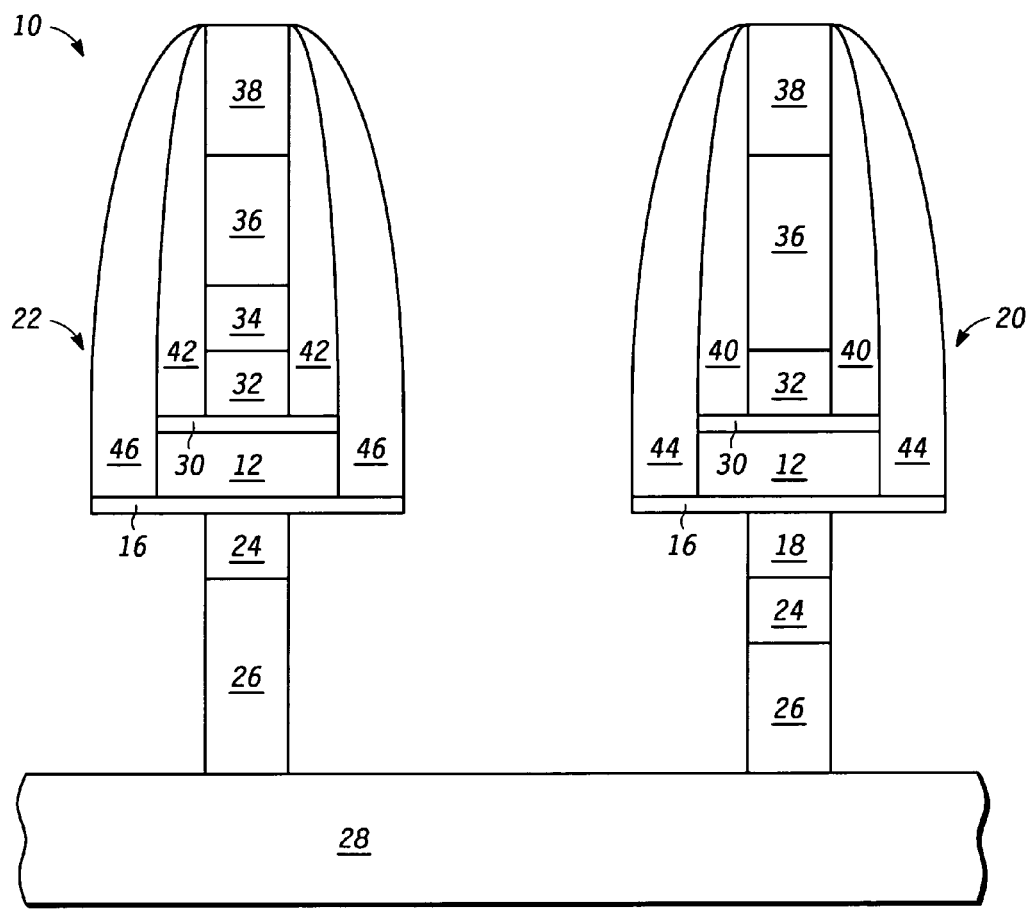
FIG. 14 is a cross section of the semiconductor device at a stage in the process subsequent to that shown in FIG. 13

Shown in FIG. 14 is semiconductor device structure 10 after performing an isotropic etch of polysilicon layer 26, gate metal layer 24, and gate metal 18. The metals chosen for gate metals 18 and 24 etch at the same rate, especially since they are only about 100 Angstroms in thickness. Preferably polysilicon layer 26 is etched first in a timed etch. The gate metals 18 and 24 are then etched also in a timed etch. These two etches leave an P channel bottom gate stack comprised of a portion of polysilicon layer 26 and gate metal layer 24 under the P channel top gate stack. Similarly, an N channel bottom gate stack remains that is comprised of a portion of polysilicon layer 26 and portions of gate metals 18 and 24 under the N channel top gate stack. The metal and polysilicon etch rates are controllable so that the resulting widths are the same as for the P and N channel top gate stacks. Further the bottom and top gate stacks are aligned to each other because the process is self-aligning. The sidewall spacers that form the masks for the etches are all formed around the top gate stacks and are equidistant around the top gate stacks.

Figure 15:
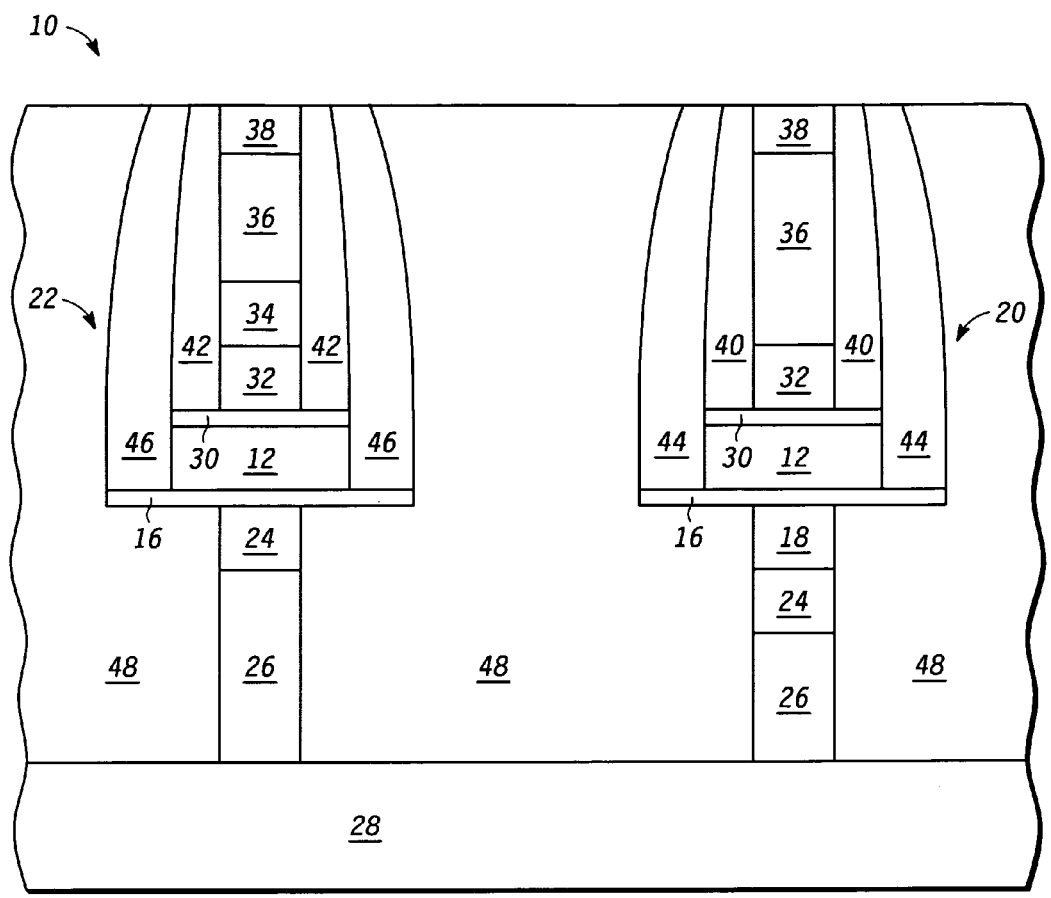
FIG. 15 is a cross section of the semiconductor device at a stage in the process subsequent to that shown in FIG. 14.

Shown in FIG. 15 is semiconductor device structure 10 after depositing an oxide layer 48 that extends beyond the top of the top gate stacks. A polish step is then performed which removes some of hard mask 38 from the top gate stacks and results in the top of the top gate stacks being co-planar with oxide layer 48.

Figure 16:
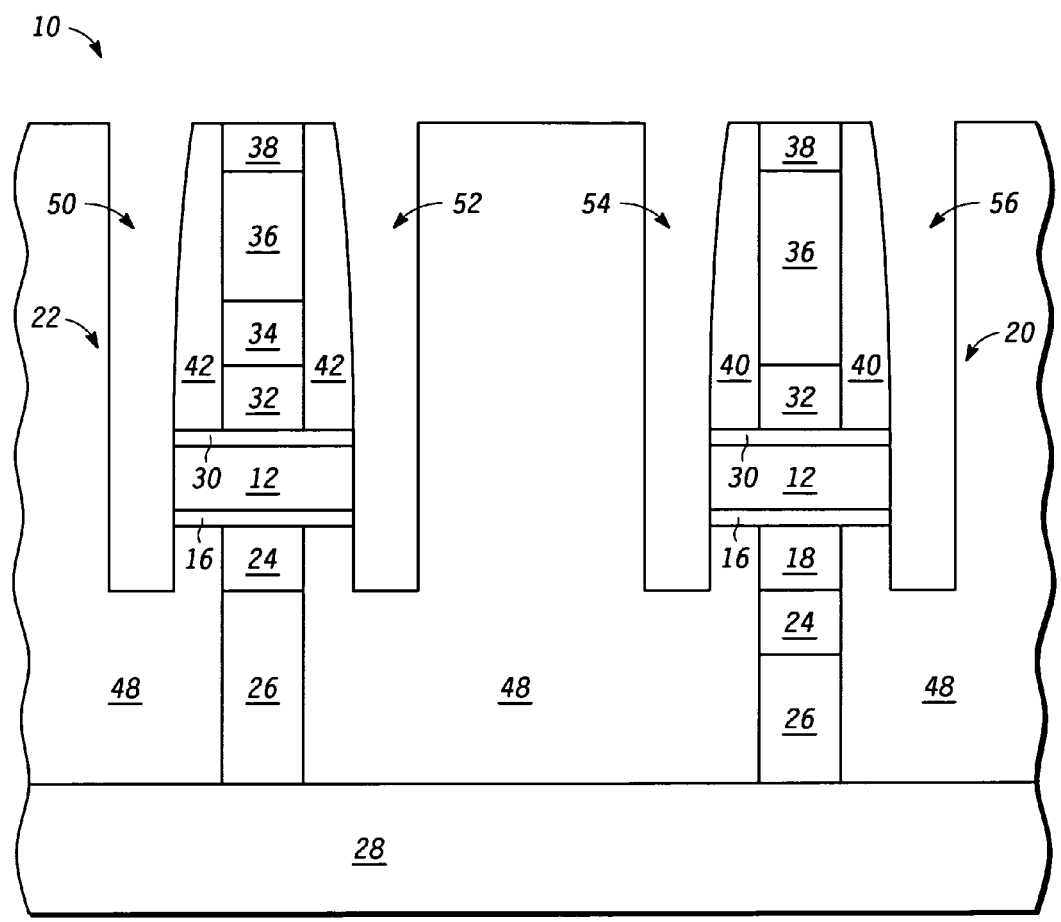
FIG. 16 is a cross section of the semiconductor device at a stage in the process subsequent to that shown in FIG. 15.

Shown in FIG. 16 is semiconductor device structure 10 after a patterned etch of oxide layer 48 adjacent to the gate stacks so that channel the P and N channel regions are exposed. Thus the sources and drains of P and N transistors are self-aligned to the gates.

Figure 17:
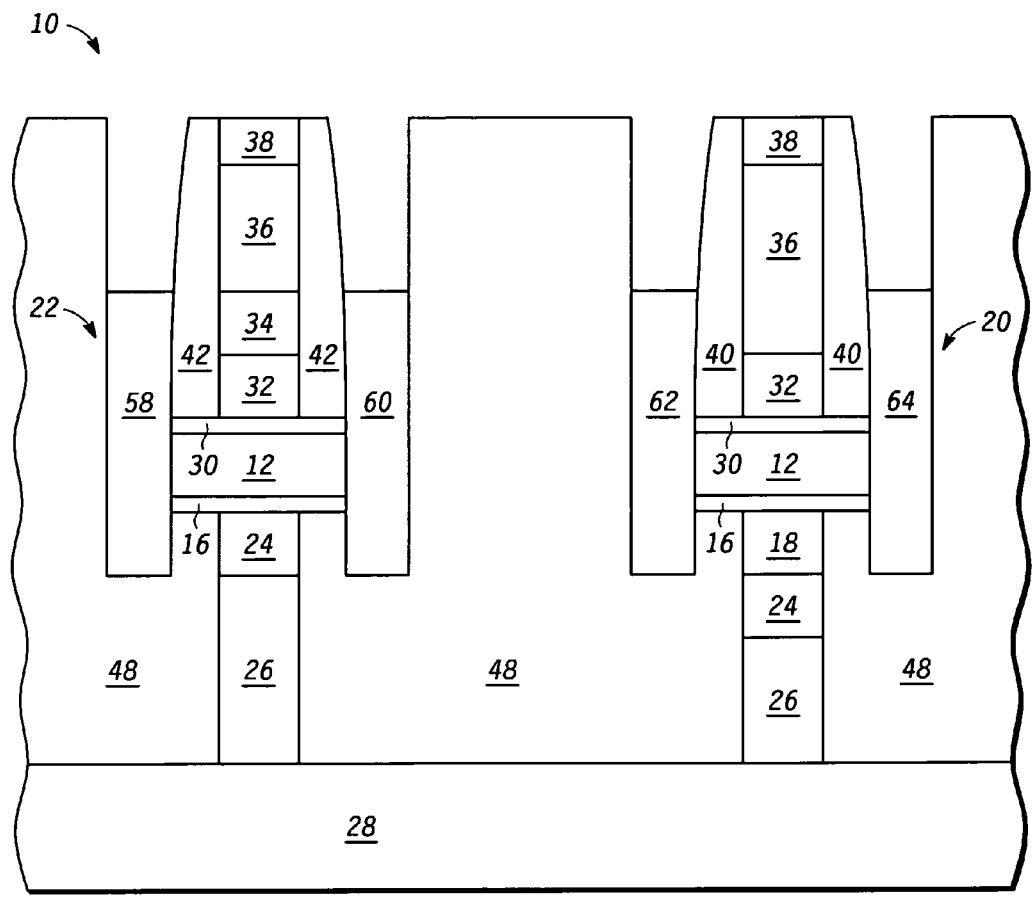
FIG. 17 is a cross section of the semiconductor device at a stage in the process subsequent to that shown in FIG. 16.

Shown in FIG. 17 is semiconductor device structure 10 after epitaxially growing a source/drain region 58 from one side of the P channel, a source/drain region 60 from the other side of the P channel, a source/drain region 62 on one side of the N channel, and a source/drain 64 on the other side of the N channel. Source/drain regions 58 and 60 are preferably implanted with a P type dopant, preferably boron, while N region 20 is masked. Similarly, source/drain regions 62 and 64 are preferably implanted with an N type dopant, preferably both arsenic and phosphorus, while P channel region 22 is masked.

The result is a device structure which achieves the benefits of a multi-gate device, does not unduly complicate the process, and the desired work function for the P channel gate and the desired work function for the N channel gate are not sacrificed.

Various other changes and modifications to the embodiments herein chosen for purposes of illustration will readily occur to those skilled in the art. For example, the doping of the source/drain regions may be achieved in some other fashion such as in situ doping during epitaxial growth. To the extent that such modifications and variations do not depart from the spirit of the invention, they are intended to be included within the scope thereof which is assessed only by a fair interpretation of the following claims.

What is claimed is:

1. A method of forming a planar double gate device comprising:
   forming a first bottom gate stack on a semiconductor substrate in a first-type transistor region;
   forming a second bottom gate stack on the semiconductor substrate in a second-type transistor region;
   forming a channel layer from the semiconductor substrate;
   forming a first top gate stack on a top dielectric layer surface in one selected from a group consisting of the first-type transistor region and the second-type transistor region;
   forming a second top gate stack over the channel layer in the other of the first-type transistor region or second-type transistor region, different from the transistor region of the first top gate stack;
   patterning the first top gate stack and the second top gate stack to form a patterned first top gate stack and a patterned second top gate stack in respective ones of the first-type transistor region or the second-type transistor region;
   forming initial sidewall spacers on the patterned first top gate stack and on the patterned second top gate stack;
   patterning the channel layer (i) in a region corresponding to the region of the patterned first top gate stack, using the patterned first top gate stack with initial sidewall spacers as a mask to leave a patterned first channel layer and (ii) in a region corresponding to a region of the patterned second top gate stack, using the patterned second top gate stack with initial sidewall spacers as a mask to leave a patterned second channel layer;
   forming second sidewall spacers on (i) the patterned semiconductor channel layer and the patterned first top gate stack with initial sidewall spacers and (ii) the patterned semiconductor channel layer and the patterned second top gate stack with initial sidewall spacers;
   patterning (i) one of (a) a first bottom gate stack or (b) a second bottom gate stack in a region corresponding to the region of the patterned first top gate stack, using the patterned semiconductor channel layer with second sidewall spacers and the patterned first top gate stack with initial sidewall spacers as a mask and (ii) the other one of (a) the first bottom gate stack or (b) the second bottom gate stack in a region corresponding to the region of the patterned second top gate stack, using the patterned semiconductor channel layer with second sidewall spacers and the patterned second top gate stack with initial sidewall spacers as a mask;
   defining (i) a first bottom gate dimension in the first bottom gate stack in the first-type transistor region, wherein defining the bottom gate dimension in the first bottom gate stack corresponds to patterning the first bottom gate stack and (ii) a second bottom gate dimension in the second bottom gate stack in the second-type transistor region, wherein defining the second bottom gate dimension in the second bottom gate stack corresponds to patterning the second bottom gate stack;
   depositing a dielectric fill material into void regions proximate to the patterned first and second bottom gate stacks and the patterned first and second top gate stacks, wherein the void regions comprise voids created during the patterning of the first and second bottom gate stacks in respective first-type and second-type transistor regions;
   forming source/drain cavities in the dielectric fill material within
      (i) the first-type transistor region, the source/drain cavities extending along a height dimension of (a) one of the patterned first top gate stack or patterned second top gate stack within the first-type transistor region, (b) the patterned first channel layer, and (c) the patterned first bottom gate stack in the first-type transistor region, the source/drain cavities further exposing sidewall portions of the patterned semiconductor channel layer in the first-type transistor region, and
      (ii) the second-type transistor region, the source/drain cavities extending along a height dimension of (a) the other one of the patterned first top gate stack or patterned second top gate stack within the second-type transistor region, (b) the patterned second channel layer, and (c) the patterned second bottom gate stack in the second-type transistor region, the source/drain cavities further exposing sidewall portions of the patterned semiconductor channel layer in the second-type transistor region; and
   filling the source/drain cavities within (i) the first-type transistor region with a first source/drain material and (ii) the second-type transistor region with a second source/drain material.

2. The method of claim 1, wherein the first bottom gate stack comprises a first bottom gate dielectric, a first bottom gate conductor, and a cap layer.

3. The method of claim 2, wherein the second bottom gate stack comprises a second bottom gate dielectric, a second bottom gate conductor, and a cap layer, the second bottom gate conductor being different from the first bottom gate conductor.

4. The method of claim 3, wherein the first bottom gate stack further comprises the second bottom gate conductor disposed between the first bottom gate conductor and the cap layer.

5. The method of claim 3, further wherein the first bottom gate dielectric and the second bottom gate dielectric comprise the same bottom gate dielectric, and wherein the cap layer of the first bottom gate stack and of the second bottom gate stack comprise the same cap layer.

6. The method of claim 3, wherein the first bottom gate conductor comprises a first metal having a first work-function and wherein the second bottom gate conductor comprises a second metal having a second work-function.

7. The method of claim 6, wherein:
   the first top gate stack comprises a first top gate dielectric, a first top gate conductor, and a first hard mask layer; and
   the first top gate conductor comprises a third metal having a third work-function and wherein the second top gate conductor comprises a fourth metal having a fourth work-function, the fourth work-function being different from the third work-function.

8. The method of claim 3, wherein the first bottom gate conductor in the first-type transistor region is co-planar with the second bottom gate conductor in the second-type transistor region.

9. The method of claim 1, wherein the semiconductor substrate comprises one selected from the group consisting of a bulk semiconductor substrate and a strained semiconductor substrate.

10. The method of claim 6, wherein forming the channel layer comprises cleaving the semiconductor substrate at a predefined cleaving region within the semiconductor substrate.

11. The method of claim 10, wherein forming the channel layer further comprises bonding a handle wafer to the respective cap layer of the first and second bottom gate stacks prior to cleaving.

12. The method of claim 1, wherein the first top gate stack comprises a first top gate dielectric, a first top gate conductor, and a first hard mask layer.

13. The method of claim 12, wherein the second top gate stack comprises a second top gate dielectric, a second top gate conductor, and a second hard mask layer.

14. The method of claim 13, further wherein the second top gate conductor is different from the first top gate conductor.

15. The method of claim 14, wherein the first top gate stack further comprises the second top gate conductor disposed between the first top gate conductor and the first hard mask layer.

16. The method of claim 13, further wherein the first top gate dielectric and the second top gate dielectric comprise the same top gate dielectric, and wherein the first hard mask layer of the first top gate stack and the second hard mask layer of the second top gate stack comprise a multi-layer hard mask layer.

17. The method of claim 13, wherein the first top gate conductor is co-planar with the second top gate conductor.

18. The method of claim 1, further wherein the defining of respective ones of the bottom gate dimensions includes self-aligning of a corresponding defined first bottom gate stack and defined second bottom gate stack with a respective one of the patterned first top gate stack or the patterned second top gate stack.

19. The method of claim 1, wherein filling comprises one selected from a group consisting of (i) epitaxially growing semiconductor material in the source/drain cavities and (ii) using a deposit and etch back filling of semiconductor material in the source/drain cavities.

20. The method of claim 1, wherein (a) the first-type transistor region comprises one selected from the group consisting of (i) a first N-type transistor region and (ii) a first P-type transistor region, and (b) the second-type transistor region comprises one selected from the group consisting of (i) the first N-type transistor region, (ii) a second N-type transistor region different from the first N-type transistor region, (iii) the first P-type transistor region, and (iv) a second P-type transistor region different from the first P-type transistor region.

* * * * *